United States Patent [19]

Benecke et al.

[11] Patent Number: 4,994,336

[45] Date of Patent: Feb. 19, 1991

[54] METHOD FOR MANUFACTURING A CONTROL PLATE FOR A LITHOGRAPHIC DEVICE

[75] Inventors: Wolfgang Benecke; Uwe Schnakenberg, both of Berlin; Burkhard Lischke, Munich, all of Fed. Rep. of Germany

[73] Assignee: Siemens Aktiengesellschaft, Berlin and Munich, Fed. Rep. of Germany

[21] Appl. No.: 353,063

[22] Filed: May 17, 1989

[30] Foreign Application Priority Data

May 31, 1988 [DE] Fed. Rep. of Germany ....... 3818535

[51] Int. Cl.[5] ............................................... G03F 1/16
[52] U.S. Cl. ...................................... 430/5; 430/323; 430/324; 250/505.1; 250/492.3
[58] Field of Search ................... 430/5, 321, 323, 324; 250/492.22, 492.21, 505.1

[56] References Cited

U.S. PATENT DOCUMENTS

| | | | |
|---|---|---|---|
| 4,393,127 | 7/1983 | Greschner et al. | 430/5 |
| 4,417,946 | 11/1983 | Bohlen et al. | 156/643 |
| 4,448,865 | 5/1984 | Bohlen et al. | 430/5 |
| 4,724,328 | 2/1988 | Lischke | 250/492.2 |
| 4,780,382 | 10/1988 | Stengl et al. | 430/5 |

FOREIGN PATENT DOCUMENTS

0191439A1  8/1986  European Pat. Off. .

OTHER PUBLICATIONS

Behringer et al., "Shadow Projection Mask and Method of Producing Same", IBM Tech. Disc. Bull., vol. 27 (6), Nov. 1984.

Primary Examiner—Jose G. Dees
Attorney, Agent, or Firm—Hill, Van Santen, Steadman & Simpson

[57] ABSTRACT

A method for manufacturing a control plate for a lithographic device. The control plate manufactured with a method of the present invention is essentially composed of a semiconductor substrate having an opening for the passage of particle probes emanating from a multi-beam source and of a corresponding plurality of deflection elements that are connected via bond pads and connecting lines to the electronics of the lithographic device that generates control signals. Lithographic methods and voltaic shaping techniques are utilized for the manufacture of the deflection elements located on the semiconductor substrate which is coated with a dielectric.

6 Claims, 5 Drawing Sheets

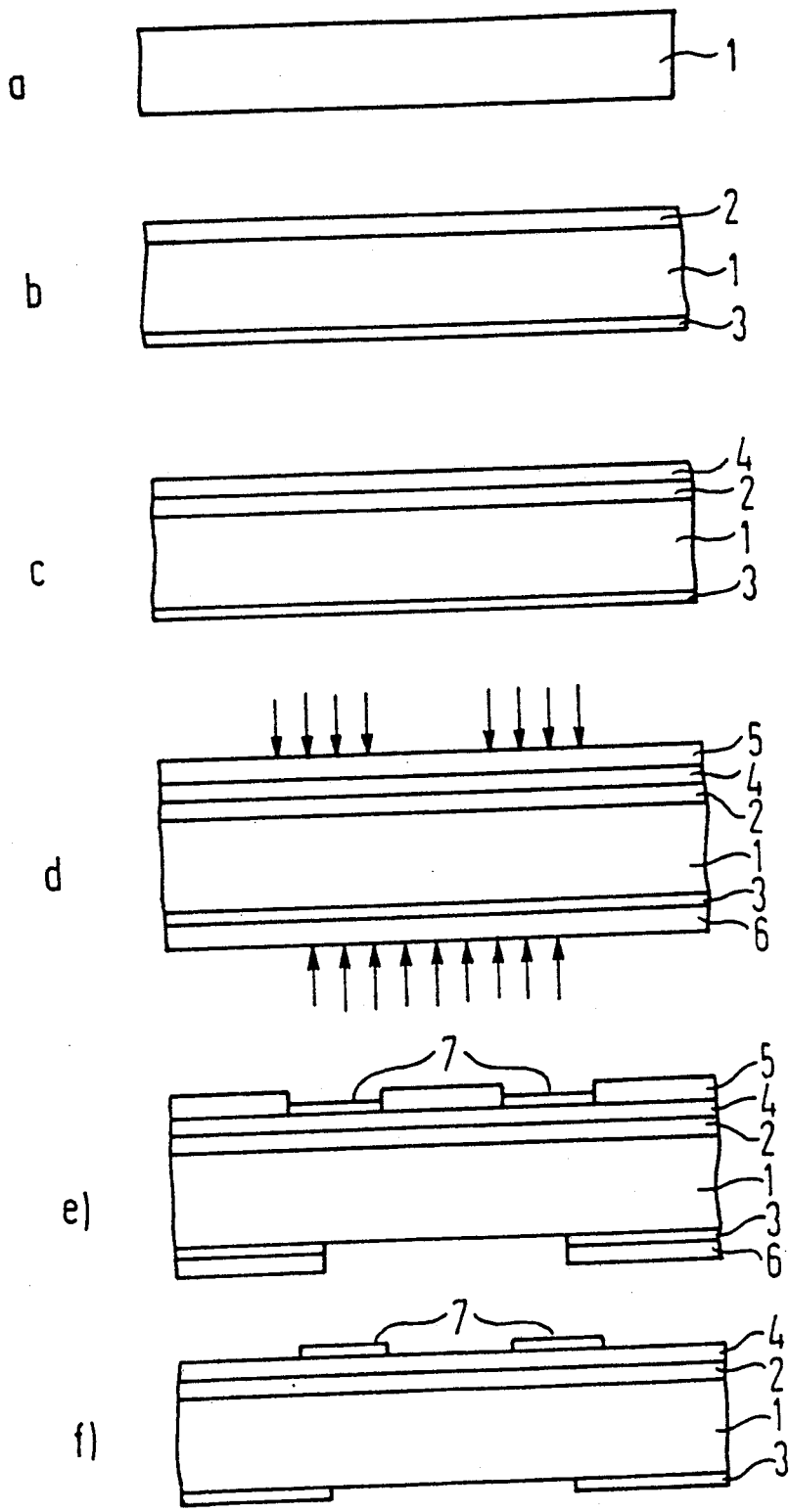

g)

h)

i)

j)

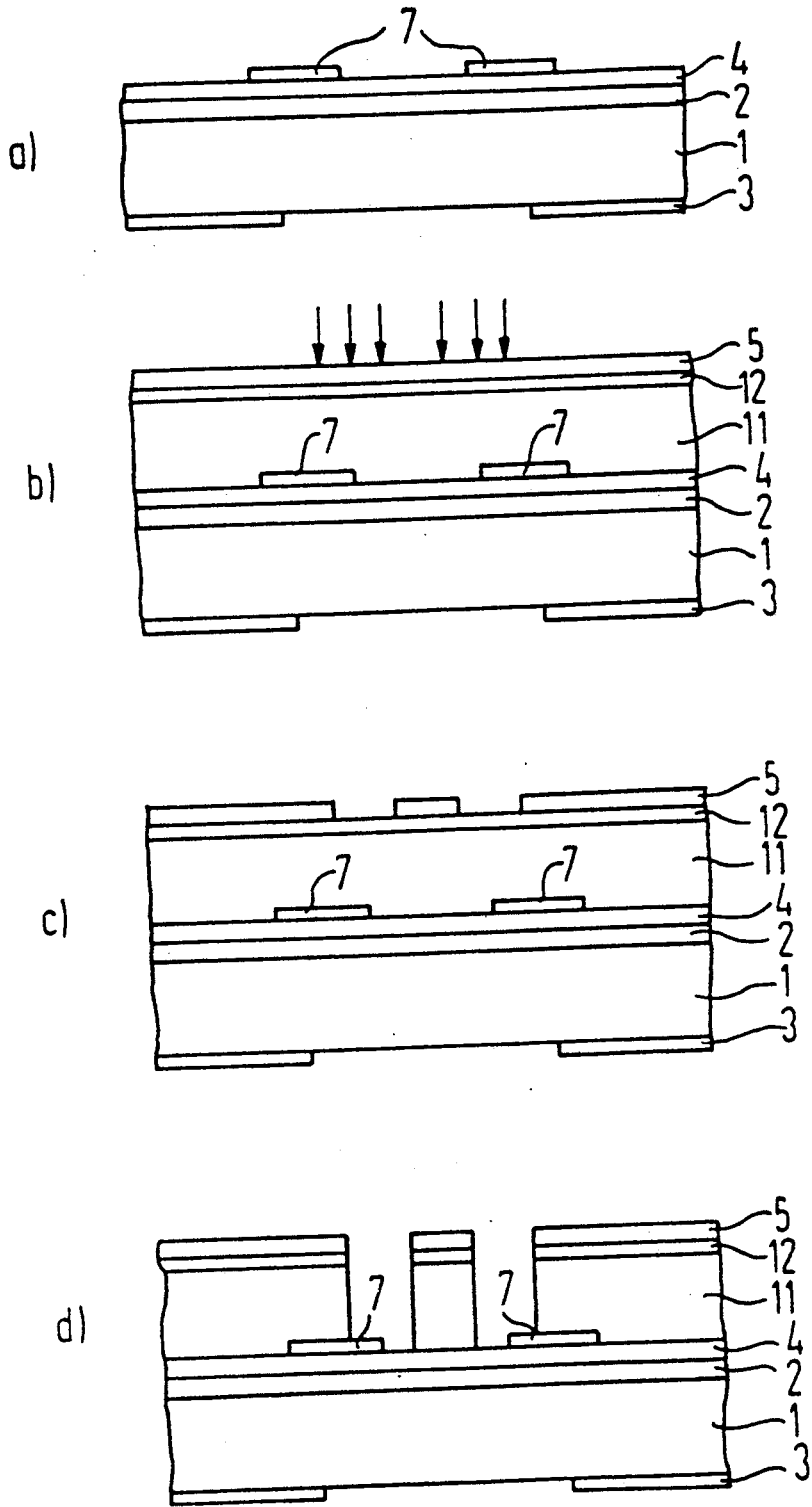

e)

f)

g)

METHOD FOR MANUFACTURING A CONTROL PLATE FOR A LITHOGRAPHIC DEVICE

BACKGROUND OF THE INVENTION

The present invention is directed to a method for manufacturing a control plate for a lithographic device.

U.S. Pat. No. 4,724,328 discloses a lithographic apparatus (electron beam writer) whose electron-optical column structure has an apertured diaphragm for generating a plurality of individually deflectable electron probes. The apertured diaphragm, disclosed in greater detail in European reference EP 0 191 439 A1, is essentially composed of a silicon membrane provided with a line-shaped multi-hole structure with an electrode system acting as a deflecting unit located on a surface thereof.

SUMMARY OF THE INVENTION

An object of the present invention is to provide a method for manufacturing a control plate for a lithographic device, whereby the control plate charged with a plurality of particle probes has a semiconductor substrate having an opening for the passage of the particle probes and a plurality of deflection elements corresponding in number to the plurality of particle probes. This object is inventively achieved by two alternative embodiments of the method of the present invention.

One method has the following steps:

a semiconductor substrate has a front side provided with a first dielectric layer and has a back side provided with a second dielectric layer;

a metallic layer is deposited on the first dielectric layer;

the second dielectric layer is structured according to the geometry of the opening to be produced in the semiconductor substrate;

the geometry and arrangement of the deflection elements to be produced is lithographically transferred onto a photoresist layer applied on the metallic layer, whereby the thickness of the photoresist layer exceeds the height of the deflection elements;

the photoresist layer is removed;

the opening is produced by etching the back side of the semiconductor substrate; and the metallic layer and the first dielectric layer in the region of the opening are removed with an etching process.

An alternative method has the following steps:

a semiconductor substrate is provided with a first dielectric layer at the front side and is provided with a second dielectric layer at the back side;

a metallic layer is deposited on the first dielectric layer;

the second dielectric layer is structured according to the geometry of an opening to be generated in the semiconductor substrate;

the metallic layer is coated with a first and a second intermediate layer, whereby the thickness of the first intermediate layer is dimensioned such that it exceeds the height of the deflection elements to be formed;

the geometry and arrangement of the deflection elements to be generated is lithographically transferred on to a photoresist layer applied on the second intermediate layer;

the structure of the photoresist layer is transferred by an etching of the first and second intermediate layers;

the depressions generated in the first intermediate layer are voltaically filled up to the height of the deflection elements;

the photoresist layer and the first and second intermediate layers are removed;

the opening is generated by anisotropic etching of the semiconductor substrate at the back side of the semiconductor substrate; and the first dielectric layer and the metallic layer in the region of the opening are removed with an etching process.

The semiconductor substrate is composed of silicon in a preferred embodiment and may have either a (1, 0, 0) orientation or a (1, 1, 0) orientation.

An advantage of the invention is that the deflection elements manufactured with the method of the present invention can be charged with control voltages that are standard in microelectronics.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIGS. 2a-2j and 3a-13g depict process sequences for the manufacture of the control plate.

DESCRIPTION OF THE PREFERRED EMBODIMENT

Figure 1:
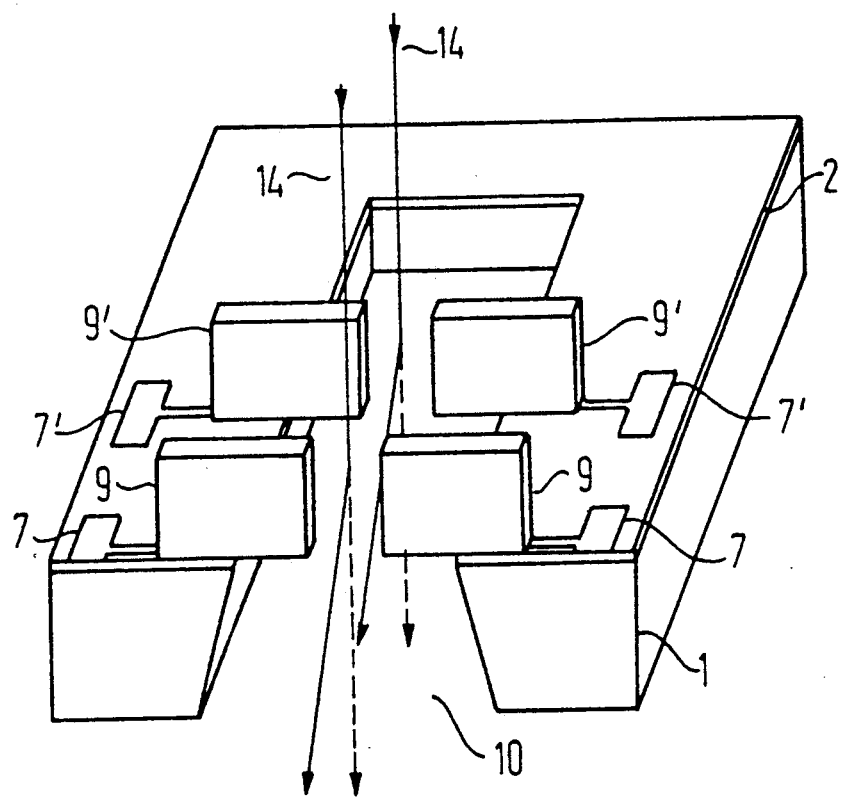
FIG. 1 is a schematic perspective view of the structure of the control plate to be manufactured.

The control plate schematically illustrated in FIG. 1 is essentially composed of a single-crystal semiconductor substrate 1 having a window or opening 10 for the passage of particle probes 14, 14' emanating from a multi-beam source. The control plate has a corresponding plurality of deflection elements 9, 9' that are connected via bond pads 7, 7' and connecting lines to the electronics of the electron or ion beam lithographic device that generates control signals. A diaphragm provided with recesses is preferably used as a multi-beam source, this diaphragm being located above the control plate and being charged with a large-area, primary particle beam. Each of the particle probes 14, 14' has a deflection element 9, 9' of the control allocated to it with which the respective particle probe 14, 14' can be individually deflected and, as warranted, blanked (blanking of a particle probe is on a diaphragm arranged under the control plate in the beam path). For manufacturing the deflection elements 9, 9', the bond pads 7, 7', which may be reinforced, and the connecting lines on the semiconductor member 1 which is coated with a dielectric 2, lithographic methods and galvanic shaping techniques are preferably used. The lithography is performed dependent on the dimensions and on the complexity of the structures to be produced, being performed with ultraviolet or synchrotron radiation. The height of the deflection elements 9, 9' amounts to a few 10 $\mu$m, particularly 10 through 100 $\mu$m, so that standard control voltages of microelectronics can be used.

Figure 2:
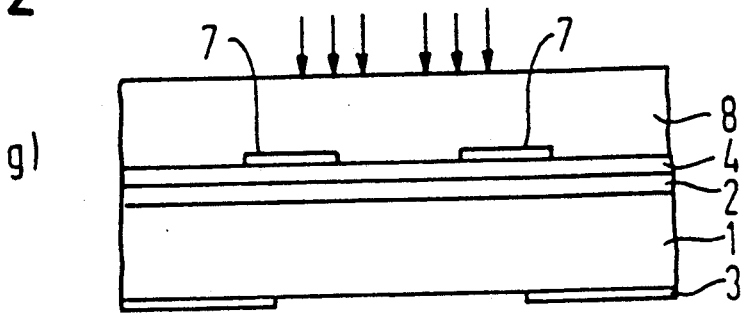
Figure 2:
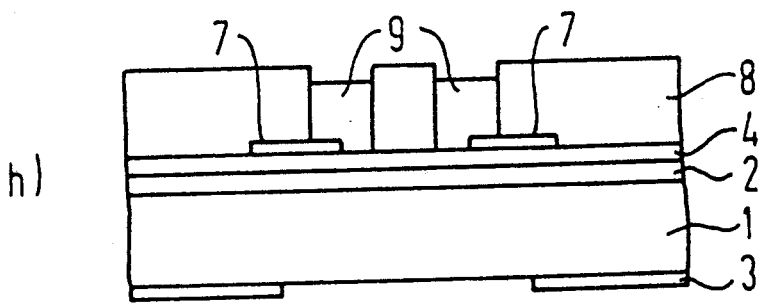
Figure 2:
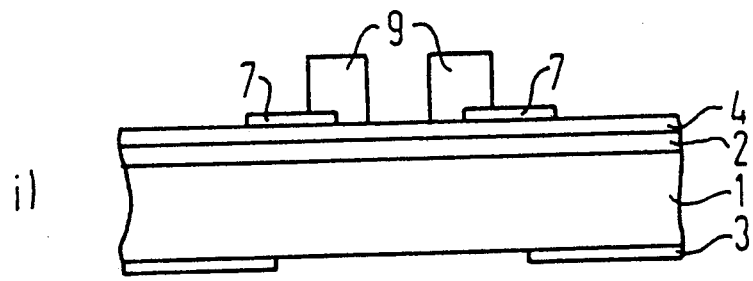
Figure 2:
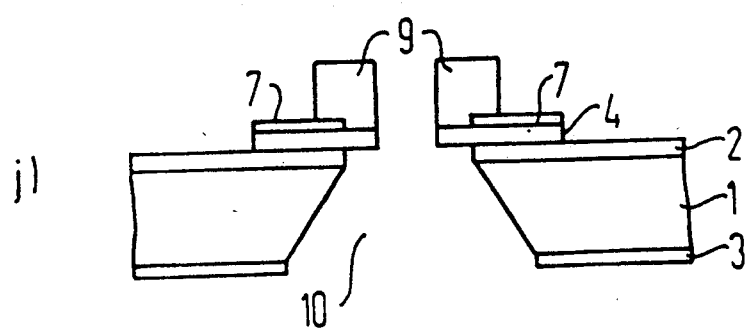

The process for manufacturing the control plate shown in FIG. 1 inventively has the following method steps (see FIGS. 2a-2j):

Deposition of a first dielectric layer 2, for example of a silicon nitride or silicon oxide layer, on a semiconductor substrate 1, for example silicon having (1, 0, 0) orientation or (1, 1, 0) orientation (FIGS. 2a, 2b).

Deposition of a second dielectric layer 3, for example of a silicon nitride or silicon oxide layer, on the underside of the substrate (FIG. 2b).

Deposition of a metallic electroplating starter layer 4, for example of a chrome-gold or titaniumgold layer, on the dielectric layer 2 (FIG. 2c).

Lithographic transfer of the geometry of the substrate through opening 10 onto a photoresist layer 6 deposited onto the dielectric layer 3 and etching (structuring) of the dielectric layer 3 (FIGS. 2d–2e).

Lithographic transfer of the geometry and arrangement of the connecting lines and of the bond pads 7, 7' onto a photoresist layer 5 deposited onto the electroplating starter layer 4 (FIG. 2d).

Voltaic reinforcement of the connecting lines 7 and removal of the photoresist layer 5 (FIGS. 2e, 2f).

Coating a front wafer side with a photoresist layer 8 whose thickness is greater than the desired height of the deflection elements 9 to be shaped (FIG. 2g).

Lithographic transfer of the geometry and arrangement of the deflection elements 9 onto the photoresist layer 8 (FIG. 2g).

Voltaic filling of the depressions produced in the photoresist layer 8 up to the desired height of the deflection elements 9 (FIG. 2h).

Removing the photoresist layer 8 (FIG. 2i).

Anisotropic, wet-chemical etching of the semiconductor substrate 1 on the back side of the wafer for generating the substrate opening 10 (FIG. 2j).

Etching the dielectric layer (2) and the electroplating starter layer 4 in the region of the opening 10 (FIG. 2j).

Figure 3:
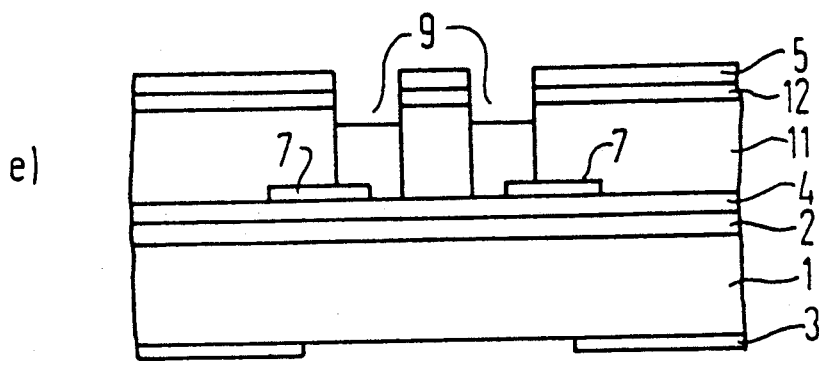
Figure 3:
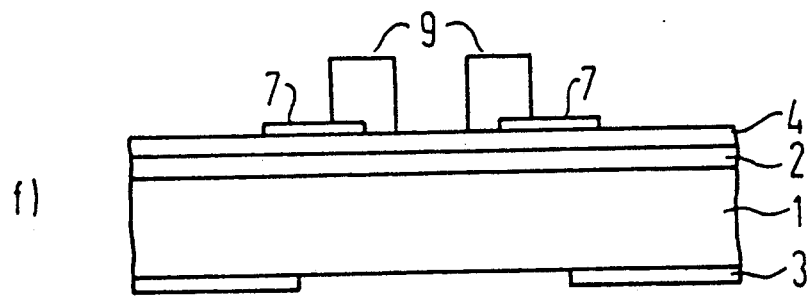
Figure 3:
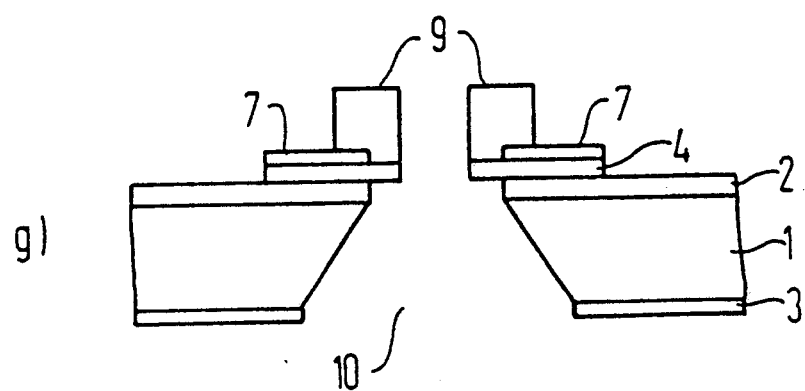

According to further features of the present invention, the deflection elements 9 can also be manufactured by applying a three-layer technique. This process then encompasses the method steps set forth with reference to FIG. 3, whereby the structure illustrated in FIG. 2f forms the starting point:

Coating the front wafer side with a lacquer or plastic 11 (for example, polyimide), whose thickness is dimensioned such that it exceeds the height of the deflection elements 9 to be formed (FIGS. 3a, 3b).

Application of a second intermediate layer 12, for example an aluminum nitride or silicon nitride layer (FIG. 3b).

Lithographic transfer of the geometry and arrangement of the deflection elements 9 onto a photoresist layer 5 deposited onto the intermediate layer 12 (FIGS. 3b, 3c).

Etching (structuring) the intermediate layers 11 and 12 (FIG. 3d).

Voltaically filling the depressions produced in the first intermediate layer 11 up to the desired height of the deflection elements 9 (FIG. 3e).

Removing the photoresist layer 5 and the intermediate layers 11 and 12 (FIG. 3f).

Anisotropic, wet-chemical etching of the substrate 1 on the back side of the wafer for generating the opening 10 (FIG. 3g).

Etching the dielectric layer 2 and the electroplating starter layer 4 in the region of the opening 10 (FIG. 3g).

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for manufacturing a control plate for a lithographic apparatus, whereby the control plate charged with a plurality of particle probes (14, 14') has a semiconductor substrate (1) having an opening (10) for the passage of the particle probes (14, 14') and has a plurality of deflection elements (9, 9') for individually deflecting the particle probes (14, 14'), comprising the steps of:

providing on a front side of the semiconductor substrate (1) a first dielectric layer (2) and providing on a back side of the semiconductor substrate (1) a second dielectric layer (3); depositing a metallic layer (4) on the first dielectric layer (2);

structuring the second dielectric layer (3) according to the geometry of the opening (10) to be produced in the semiconductor substrate (1);

lithographically transferring the geometry and arrangement of the deflection elements (9, 9') to be produced onto a photoresist layer (8) applied on the metallic layer (4), whereby the thickness of the photoresist layer (8) exceeds the height of the deflection elements (9, 9'); voltaically filling up the depressions generated in the photoresist layer (8) to the desired height of the deflection elements (9, 9'); removing the photoresist layer (8);

producing the opening (10) by etching the back side of the semiconductor substrate (1); and removing the metallic layer (4) and the first dielectric layer (2) in the region of the opening (10).

2. A method for manufacturing a control plate for a lithographic device, whereby the control plate charged with a plurality of particle probes (14, 14') has a semiconductor substrate (1) having an opening (10) for the passage of the particle probes (14, 14') and has a plurality of deflection elements (9, 9') for individually deflecting the particles probes (14 14'), comprising the steps of:

providing on a front side of the semiconductor substrate (1) a first dielectric layer (2) and providing on a back side of the semiconductor substrate a second dielectric layer (3);

depositing a metallic layer (4) on the first dielectric layer (2);

structuring the second dielectric layer (3) according to the geometry of the opening (10) to be generated in the semiconductor substrate (1);

coating the metallic layer with a first (11) and a second intermediate layer (12), whereby the thickness of the first intermediate layer (11) is dimensioned such that it exceeds the height of the deflection elements (9, 9') to be formed;

lithographically transferring the geometry and arrangement of the deflection elements (9, 9') to be generated onto a photoresist layer (5) applied on the second intermediate layer (12);

transferring the structure of the photoresist layer (5) by an etching of the first and second intermediate layers (11, 12);

voltaically filling the depressions generated in the first intermediate layer (11) up to the height of the deflection elements (9, 9');

removing the photoresist layer (5) and the first and second intermediate layers (11, 12);

generating the opening (10) by anisotropic etching of the semiconductor substrate at the back side of the semiconductor substrate; and removing the first dielectric layer (2) and the metallic layer (4) in the region of the opening (10).

3. The method according to claim 1 wherein the semiconductor substrate (1) is composed of silicon, and the silicon has a (1, 0, 0) orientation.

4. The method according to claim 1 wherein the semiconductor substrate (1) is composed of silicon, and the silicon has a (1, 1, 0) orientation.

5. The method according to claim 2 wherein the semiconductor substrate (1) is composed of silicon, and the silicon has a (1, 0, 0) orientation.

6. The method according to claim 2 wherein the semiconductor substrate (1) is composed of silicon, and the silicon has a (1, 1, 0) orientation.

* * * * *